United States Patent [19]
Kloczewski et al.

[11] 3,753,720
[45] Aug. 21, 1973

[54] SOLDER RESISTANT PHOTOPOLYMER COMPOSITIONS

[75] Inventors: Harold A. Kloczewski, Pasadena; Joseph D. Moyer, Silver Spring; David E. Kramm, Laurel; William Ross Schaeffer, Baltimore, all of Md.

[73] Assignee: W. R. Grace & Co., New York, N.Y.

[22] Filed: Jan. 10, 1972

[21] Appl. No.: 216,824

[52] U.S. Cl. .............. 96/115 R, 96/35.1, 96/115 P, 204/159.13, 204/159.14, 204/159.15
[51] Int. Cl. .............................................. G03c 1/70
[58] Field of Search ....................... 96/115 P, 115 R, 96/35.1; 204/159.13, 159.14, 159.15

[56] References Cited

UNITED STATES PATENTS

| | | | |
|---|---|---|---|
| 3,537,853 | 11/1970 | Wessells et al. | 96/115 R |
| 3,619,393 | 11/1971 | Stahly | 204/159.15 |
| 3,701,721 | 10/1972 | Lard | 204/159.16 |
| 3,708,413 | 1/1973 | Kehr et al. | 204/159.14 |

*Primary Examiner*—Ronald H. Smith
*Attorney*—Richard P. Plunkett et al.

[57] ABSTRACT

This invention relates to heat and solder resistant, photopolymer compositions which can be imaged and developed and processes of using same. The solder resistant, photocurable, photoresist compositions comprise a polythiol, polyene and silicone oil. The liquid compositions, when applied to a printed circuit board and cured imagewise as desired to a solid in the presence of a free radical generator, permit passage of the board through a bath of molten solder to secure electrical components thereto. When the free radical generator is actinic radiation, e.g., UV light, a curing rate accelerator, e.g., benzophenone is usually added to the composition.

3 Claims, 5 Drawing Figures

SOLDER RESISTANT PHOTOPOLYMER COMPOSITIONS

This invention relates to liquid solder resistant photopolymer compositions and processes therefor which permit soldering of electrical or electronic components to printed circuit boards in a molton solder bath.

The soldering of electrical components to a printed circuit board is a multi-step, time-consuming task. More precisely, before the electrical components can be soldered to the board, the following steps must be carried out. An insulating board such as epoxy fiberglas board must be copper-clad. The copper-clad board is then drilled at predetermined sites where the lands holes will be. The boards are then deburred and cleaned and the cladding is washed in ammonium persulfate solution and then in water (5–10 percent $H_2SO_4$ solution) or other solvent to remove excess ammonium persulfate. A catalyst is then applied to the board for electroless deposition of copper to coat not only the inside of the drilled holes, but also the entire board. Following electroless deposition of copper, additional copper is put on the board and in the holes by electroplating. The thus electroplated copper is then covered with a conventional photoresist and exposed imagewise through a printed circuit transparency to UV light, thus curing (hardening) the exposed portion of the photoresist. The unexposed portion of the photoresist is washed off, exposing the copper thereunder, i.e., where the lands, wiring conductors and connecting pads are formed. Positive working resists can also be used, if desired at this stage. The thus exposed copper circuit is then electroplated in a tin-lead plating bath, thereby coating solder onto the exposed copper on the board and in the holes. The cured photoresist is then stripped in a solvent and/or by mechanical means and the copper under the cured photoresist is etched away in a conventional copper etching bath. It is at this point that one can then commence the sequence of steps necessary to solder electrical components to the circuit board.

Present day technique employed for soldering electrical components to a circuit board are being made obsolete by space limitations. The trend toward smaller and more functional computer systems is shrinking the size of the boards, making the lines and pads smaller and closer together. In addition, the increased functionality is requiring more multilayers for connections. Diminished size also means shorter distances between components and therefore faster speed of computer operation. Manufacturers presently solder by passing the board, coated with a heat cured screen printed solder resistant ink, through a wave soldering machine to allow the thousands of connections to be made quickly. However, the limitations on screen printing are already apparent on large (24 × 20 inches) multilayer computer platters. The next generation of computers will require line spacings which are totally beyond screen printing; therefore, a need for a solder resistant photoresist exists.

One object of the instant invention is to produce a solder resistant composition. Another object of the invention is to produce a photocurable solder resistant composition which can be applied and photocured, imagewise, in register with sufficient accuracy to meet the requirements of the next generation of printed circuit boards. Still another object of the instant invention is to produce a photocurable solder resistant composition which, in its cured state, is capable of withstanding molten soldering bath temperatures in the range of 400°–600° F. A still further object of this invention is to produce processes employing the solder resistant photopolymer compositions which can be applied with sufficient accuracy to meet the next generation of printed circuit boards.

These and other objects and advantages of the invention will appear more clearly from the following detailed description of an illustrative embodiment thereof, with reference to the accompanying drawings, wherein:

FIG. 1 shows a printed circuit board (10) ready for processing by the instant invention, comprising an insulating material (11), e.g., epoxy fiberglas with a tin-lead solder layer (12) over the copper circuit.

Figure 1:
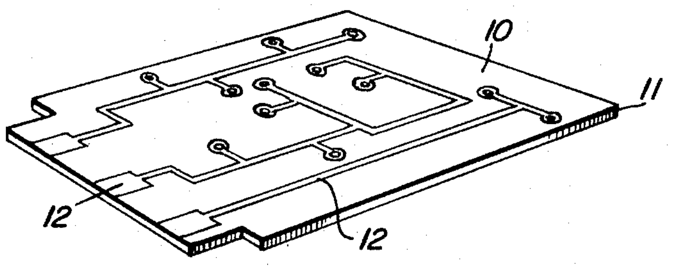
FIG. 1 is a perspective view of a conventional drilled, copper-clad electroplated printed circuit board readied for the sequence of steps used to solder electronic components thereto by the process of this invention.
Figures 2, 3:
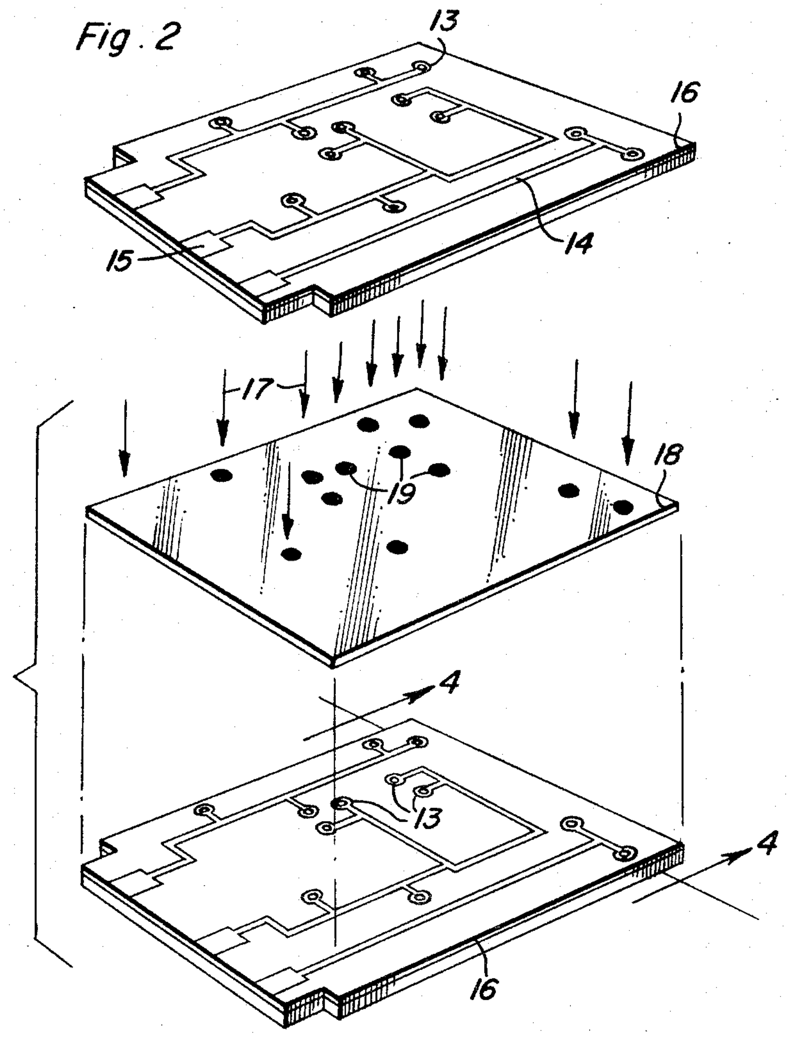
FIG. 2 is a perspective view of the board in FIG. 1, coated with the liquid photocurable solder resist of this invention.
FIG. 3 is a perspective view of the coated board being exposed to actinic radiation through an imaged transparency or mask.
Figure 4:
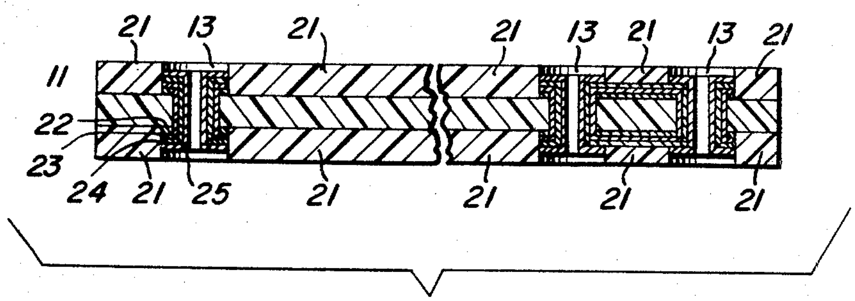
FIG. 4 is a cross sectional side view around a land with the unexposed photocurable solder resist washed away from the lands and cured, hardened, exposed solder resist remaining on the rest of the board.

In FIG. 2, the entire surface of the board including the circuit made up of the lands (13), i.e., circular conductive areas which are usually preforated at the center to allow the connecting lead of the component to be soldered thereto, wiring conductors (14) and connecting pads (15), is coated with the liquid photocurable solder resist composition (16) to the desired depth, usually 0.5–35 mils. Referring to FIGS. 3, the coated board is then exposed to actinic radiation (17) e.g., UV light, through an image bearing transparency (18) with dark image areas (19) in register with the lands (13) on the board, thus curing and insolubilizing the photocurable solder resist composition on the surface of the board except at the land areas (13). During imaging, an air gap (20) is maintained between the surface of the liquid photocurable solder resist composition (16) and the image bearing transparency (18) to facilitate subsequent development of the cured composition and insure reuseability of the transparency. The air gap can be varied as desired but is usually 1–30 mils. The exposure time is relatively rapid with exposure periods varying between 0.1 second up to 5 minutes, preferably in the range 10 to 120 seconds, depending upon the radiation source and the thickness of cured solder resist desired. FIG. 4 shows a cross section of the board around the lands after development in a suitable solvent removing the unexposed, uncured solder resist composition from the land areas (13) leaving the solid photocured solder resist composition (21) on the remaining surface of the board.

The cross sectional view in FIG. 4 also shows the buildup of materials on the insulating material (11) from prior steps necessary to prepare the board to receive electrical components (26). That is, FIG. 4 shows insulated board (11) built up with copper clad (22), electroless copper (23), electrolytic copper (24) and electroplated tin-lead alloy solder (25) respectively. Land area (13) which encompasses the holes through the built up board is free of cured solder resist after development. It is to be noted that FIG. 4 shows both sides of the board prepared to receive electrical components. This is readily carried out, when desired, by repeating the coating and exposure steps for the other side and then developing both sides. Alternatively, the entire coating exposure and development can be performed on one surface of the board and then repeated on the other surface as desired.

Figure 5:
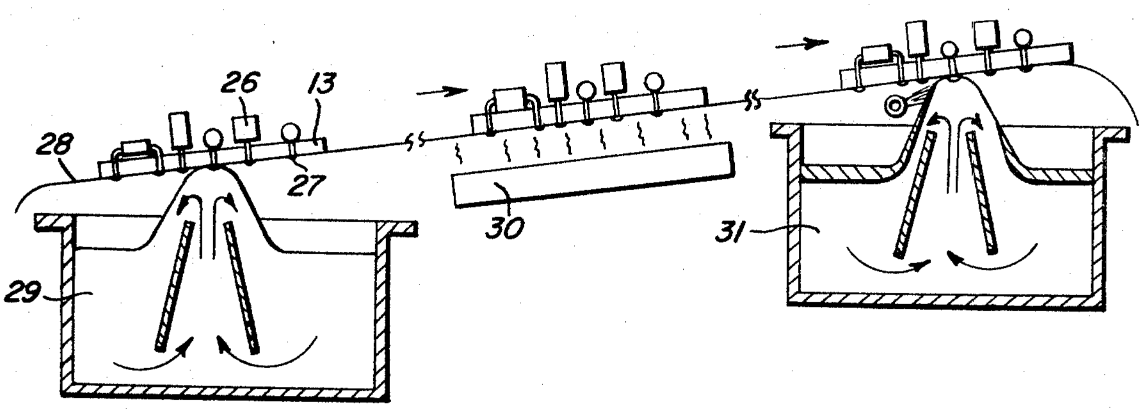
FIG. 5 shows the board with electrical components inserted in the lands being conveyed respectively over a head of flux, a preheating station and a solder bath.

Referring now to FIG. 5, the electrical components (26) to be soldered to the board are set in place in the land areas (13) with the connecting leads (27) passing through the board and the board (10) is passed by conveyor (28) or other conventional means over a flux bath (29), then over a preheating station (30) followed by passage over a conventional solder bath (31), e.g., fountain or drag type.

The fluxing, preheating and soldering steps are conventional in the art. See for example, U. S. Pat. No. 3,445,919, and U. S. Pat. No. 3,421,211 and U.S. Pat. No. 3,386,166. That is, the board is moved past a reservoir tank of resin flux whereat a continuous stream of flux is pumped into a spout to form a head of flux through which the work is passed and wetted with flux. The flux can be of either of the conventional types. That is, either a resin base flux which is dissolved e.g., in alcohol as a vehicle or a flux containing salts or organic acids dissolved in water. In both cases, the solvent is only a vehicle for carrying the flux to the surface to be cleaned. The solvent of both fluxes are volative and thus under the heat from the preheating station, will volatilize off. The purpose of the preheating station is not only to evaporate the carrier vehicle for the flux but also to preheat the printed circuit board and thus eliminate thermal shock as well as providing a higher heat content in the board prior to its reaching the soldering station. Because of the higher heat content of the printed circuit board from passage through the preheating station, the formation of icicles or solder drippings is diminished due to a retarded chilling of the board. The third purpose of the preheating station is to initiate the activity of the resin base fluxes which are mild and slow acting fluxes and substantially inert at room temperature, but which liquify and develop an acid reaction at temperatures of 200° F. The wave soldering section is a conventional reservoir with a pump which pumps the molten solder up through a spout onto the bottom of the board, thereby soldering the connecting leads of the components to the printed circuit board. The solder resist must not only withstand the chemical attack of the flux, but must be able to withstand the high temperature of the solder bath. Usually solder baths are maintained at the temperature of 400°–600° F which is too high a temperature for the employment of conventional photoresists. The solder resist of the instant invention is able to withstand both the chemical attack of the flux and the temperatures employed in the solder bath. The solder resist is also able to maintain good adhesion to the circuit board in spite of the chemicals in the fluxes and in spite of the high temperatures of the solder bath. From the solder bath the printed circuit board with the components soldered thereto can be conveyed to a washing and drying substation not shown. At the washing and drying station the solder flux is washed from the board by the operation of spraying them with a cleaning solvent such as water or a chlorinated solvent such as 1,1,1-trichloroethylene or freon depending on the solubility of the type of flux employed in the operation. The washed boards are dried by conventional means such as blowing them with a warm gas or by radiantly heating them. The resultant board is ready for use in an electrical apparatus such as a computer. If desired, one can remove the solder resist from the board by spraying the board with a solvent therefore, however, in most cases the solder resist is not removed from the board but is maintained thereon as a protective coating, It is obvious from the foregoing that the steps set out in the figures can be carried out on both sides of the board, if desired.

The critical ingredients in the solder resistant photopolymer composition are:

1. about one to 49 parts by weight of a polythiol containing at least two thiol groups per molecule;

2. about one to 49 parts by weight of a polyene selected from the group consisting of:

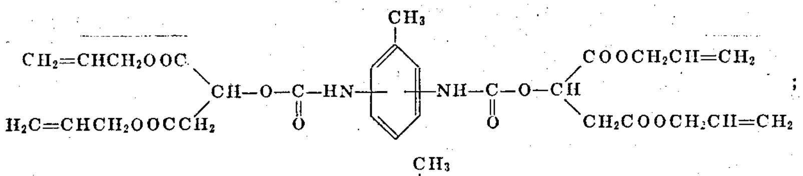
;

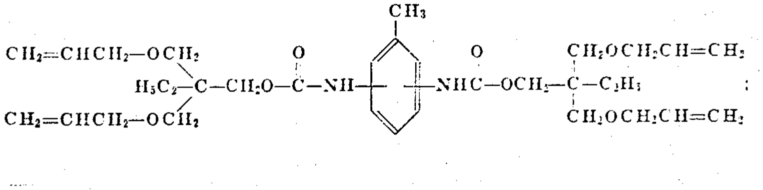
;

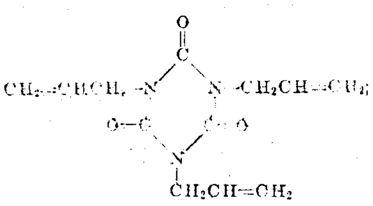
;

and a mixture of

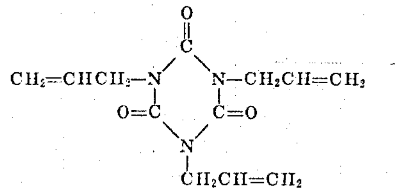

and

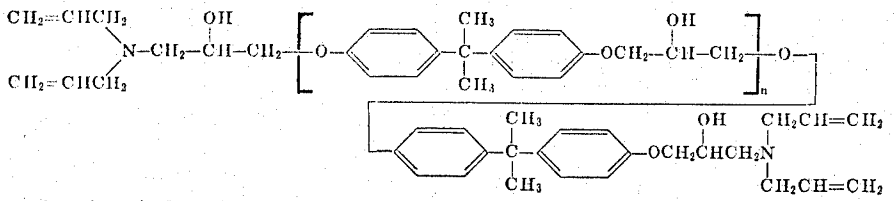

wherein $n$ is 0 or greater;

3. five to 20 parts by weight based on the weight of (1) and (2) of silicone oil and 4. 0.05 to 10 parts by weight based on the weight of (1) and (2) of a photocuring rate accelerator.

It is to be understood, however, that when energy sources other than visible or ultraviolet light are used to initiate the curing reaction, photocuring rate accelerators (i.e., photosensitizers, etc.) generally are not required in the formulation. That is to say, the actual composition of the photocuring rate accelerator, if required at all, varies with the type of energy source that is used to initiate the curing reaction.

It is to be understood that aside from the presence of a photocuring rate accelerator which depends upon the energy source it is critical that the other components of the composition be present to obtain an operable photocurable solder resistant photoresist. That is, without the polyene and the polythiol being present, no photocurable photoresist results. Additionally, without the presence of the silicone oil, "solder balling," i.e., the clinging of minute beads of solder to the resist occurs. These minute beads of solder fall off after the board has been inserted into the mechanism, hus causing short circuits. Furthermore, without the silicone oil, most compositions, due to inclusions of air bubbles, cannot be applied by the silk screen method.

Various photosensitizers, i.e., photocuring rate accelerators are operable and well known to those skilled in the art. Examples of photosensitizers include, but are not limited to benzophenone, acetophenone, acenaphthene-quinone, methyl ethyl ketone, valerophenone, hexanophenone, γ-phenylbutyrophenone, p-morpholinopropiophenone, dibenzosuberone, 4-morpholinobenzophenone, 4'-morpholinodeoxybenzoin, p-diacetylbenzene, 4-aminobenzophenone, 4'-methoxyacetophenone, benzaldehyde, α-tetralone, 9-acetylphenanthrene, 2-acetylphenanthrene, 10-thioxanthenone, 3-acetylphenanthrene, 3-acetylindole, 9-fluorenone, 1-indanone, 1, 3, 5-triacetylbenzene, thioxanthen-9-one, xanthene-9-one, 7-H-benz[de]anthracen-7-one, 1-naph-thaldehyde, 4,4'-bis (dimethylamino)benzophenone, fluorene-9-one, 1'-acetonaphthone, 2'-acetonaphthone and 2,3-butanedione, etc., which serve to give greatly reduced exposure times and thereby when used in conjunction with various forms of energetic radiation yield very rapid, commercially practical time cycles by the practice of the instant invention.

The polyenes operable in the instant invention are those set out supra. It has been found that not all polyenes are operable herein for various reasons. For example, some polyenes that have too high a viscosity cannot be applied uniformly as a coating by the screening method. Other polyenes of too low a viscosity tend to run through the holes in the printed circuit board, thereby resulting in an unevenly cured coating on the board surface. Still other polyenes, after curing, do not have sufficient heat resistance to withstand the molten solder bath.

As used herein, the term polythiols refers to simple or complex organic compounds having a multiplicity of pendant or terminally positioned -SH functional groups per average molecule.

On the average the polythiols must contain 2 or more -SH groups/molecule. They usually have a viscosity range of 0 to 20 million centipoises (cps) at 70° C as measured by a Brookfield Viscometer. Included in the term "polythiols" as used herein are those materials which in the presence of an inert solvent, aqueous dispersion or plasticizer fall within the viscosity range set out above at 70° C. Operable polythiols in the instant invention usually have molecular weights in the range 50–20,000, preferably 100–10,000.

The polythiols operable in the instant invention can be exemplified by the general formula: $R_8-(SH)_n$ where $m$ is least two and $R_8$ is a polyvalent organic moiety free from reactive carbon to carbon unsaturation. Thus $R_8$ may contain cyclic groupings and minor amounts of hetero atoms such as N, S, P or O but primarily contains carbon-hydrogen, carbon-oxygen, or silicon-oxygen containing chain linkages free of any reactive carbon to carbon unsaturation.

One class of polythiols operable with polyenes in the instant invention to obtain a polythioether photoresist are esters of thiol-containing acids of the general formula: HS-$R_9$-COOH where $R_9$ is an organic moiety containing no "reactive" carbon to carbon unsaturation with polyhydroxy compounds of the general structure: $R_{10}-(OH)_n$ where $R_{10}$ is an organic moiety containing no "reactive" carbon to carbon unsaturation and $n$ is two or greater. These components will react under suitable conditions to give a polythiol having the general structure:

$$R_{10}-\left(\begin{matrix}OC-R_9-SH\\ \| \\ O\end{matrix}\right)_n$$

where $R_9$ and $R_{10}$ are organic moieties containing no "reactive" carbon to carbon unsaturation and $n$ is two or greater.

Certain polythiols such as the aliphatic monomeric polythiols (ethane dithiol, hexamethylene dithiol, decamethylene dithiol, tolylene-2,4-dithiol, etc.) and some polymeric polythiols such as thiol-terminated ethylcyclohexyl dimercaptan polymer, etc. and similar polythiols which are conveniently and ordinarily synthesized on a commercial basis, although having obnoxious odors, are operable in this invention but many of the end products are not widely accepted from a practical, commercial point of view. Examples of the polythiol compounds preferred for this invention because of their relatively low order level include, but are not limited to, esters of thioglycolic acid ($HS\text{-}CH_2COOH$), α-mercaptopropionic acid ($HS\text{-}CH(CH_3)\text{-}COOH$) and β-mercaptopropionic acid ($HS\text{-}CH_2COOH$) with polyhydroxy compounds such as glycols, triols, tetraols, pentaols, hexaols, etc. Specific examples of the preferred polythiols include, but are not limited to, ethylene glycol bis (thioglycolate), ethylene glycol bis (β-mercaptopropionate), trimethylolpropane tris (thioglycolate), trimethylolpropane tris (β-mercaptopropionate), pentaerythritol tetrakis (thioglycolate), tris (hydroxyethyl) isocyanurate tris (β-mercaptopropionate) and pentaerythritol tetrakis (β-mercaptopropionate), most of which are commercially available. A specific example of a preferred polymeric polythiol is polypropylene ether glycol bis (β-mercaptopropionate) which is prepared from polypropylene ether glycol (e.g., Pluracol P2010, Wyandotte Chemical Corp.) and β-mercaptopropionic acid by esterification.

The preferred polythiol compounds are characterized by a low level of mercaptan-like odor initially, and after reaction, give essentially odorless polythioether end products which are commercially attractive.

The term "functionality" as used herein refers to the average number of ene or thiol groups per molecule in the polyene or polythiol, respectively. For example, a tetraene is a polyene with an average of four "reactive" carbon to carbon unsaturated groups per molecule and thus has a functionality (*f*) of four. A dithiol is a polythiol with an average of two thiol groups per molecule and thus has a functionality (*f*) of two.

The function of the silicone oil is two-fold. Firstly, it facilitates the application of the composition as a coating on the printed circuit by means of silk screening. If silicone oil is not used, the silk screened coating is full of air bubbles or inclusions which cause pin holes in the resultant cured solder resist, rendering it inoperable. Secondly, the silicone oil prevents "solder balling." Solder balling is the clinging of minute beads of solder to the resist. They can then fall off after insertion of the board into the device possibly causing a short circuit. This second problem is very prevalent in the industry and causes high labor costs associated with removal of solder balls by hand. Furthermore, the amount of silicone oil employed is critical and should be between 5–20 percent by weight of the polyene and polythiol in the composition. If less than the lower limit of silicone oil is used, solder balling will result. If greater than the upper limit is employed, a separation of phases occurs prior to curing, rendering the composition inoperable to prevent solder balling.

To obtain the maximum strength, solvent resistance, creep resistance, heat resistance and freedom from tackiness, the reactive components consisting of the polyenes and polythiols in combination with the silicone oil and curing rate accelerator of this invention are formulated in such a manner as to give solid, crosslinked, three dimensional network polythioether polymer systems on curing. In order to achieve such infinite network formation, the individual polyenes and polythiols must each have a functionality of at least 2 and the sum of the functionalities of the polyene and polythiol components must always be greater than 4. Blends and mixtures of the polyenes and the polythiols containing said functionality are also operable herein.

The solder resistant photopolymer compositions to be cured, i.e., (converted to solid resins or elastomers) in accord with the present invention may, if desired, include such additives as stabilizers, antioxidants, accelerators, dyes, inhibitors, activators, fillers, pigments, anti-static agents, flame-retardant agents, surface-active agents, extending oils, plasticizers, and the like within the scope of this invention. Such additives are usually preblended with the polyene or polythiol prior to or during the compounding step. The aforesaid additives may be present in quantities up to 500 or more parts based on 100 parts by weight of the polyene-polythiol solder resist compositions and preferably 0.005–300 parts on the same basis.

To insure that the reaction does not pre-cure prior to use, stabilizers are usually added to either the polyene or polythiol prior to admixture of these two components. Operable stabilizers include various well known commercially available materials such as octadecyl β(4-hydroxy-3,5-di-t-butylphenyl) propionate commercially available from Geigy Chemical Co., under the tradename "Irganox 1076;"2,6-ditertiary-butyl-4-methylphenol commercially available under the tradename "Ionol" from Shell Chemical Co., pyrogallol, phosphorous acid and the like. The stabilizers are usually added in amounts ranging from 0.1 to 5.0 parts per 100 parts by weight of the polyene/polythiol composition. In some instances, heat up to about 60° C is employed to dissolve the stabilizers in either the polyene or the polythiol.

The preferred means of curing is by means of electromagnetic radiation of wavelength of about 2,000–4,000 A (because of simplicity, economy and convenience). The polyene-polythiol solder resistant composition of the instant invention can be cured also by imagewise directed beams of ionizing irradiation.

When UV radiation is used for the curing reaction, a dose of 0.0004 to 6.0 watts/$cm^2$ is usually employed.

EXAMPLE 1

To a three-neck, round bottom flask equipped with stirrer and thermometer, was added 45.2 grams (0.21 moles) of diallyl malate followed by the addition of 0.050 grams of stannous octoate as a catalyst. Vigorour stirring was commenced and 17.4 grams (0.1 mole) of tolylene diiosocyanate was added to the flask at a rate to maintain the reaction temperature between 60°–65° C. After the addition of all the tolylene diiosocyanate, the reaction was continued for 2 hours. The light colored viscous tetraene product

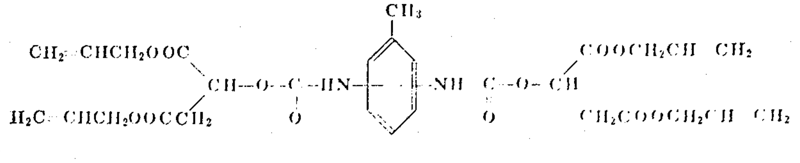

62.6 grams, contained 6.74 millimoles of carbon to carbon unsaturation per gram and will herein after be referred to as Prepolymer A.

EXAMPLE 2

A round bottom flask is fitted with a stirrer, thermometer, dropping funnel, nitrogen inlet and outlet. The flask can be placed in a heating mantle or immersed in a water bath as required.

Two moles (428 gms.) of trimethylol-propane diallyl ether were mixed with 0.2 cc. of dibutyl tin dilaurate under nitrogen. One mole of tolylene -2,4-diisocyanate was added to the mixture, using the rate of addition and cooling water to keep the temperature under 70° C. The mantle was used to keep the temperature at 70° C. for another hour. Isocyanate analysis showed the reaction to be essentially complete at this time resulting in the following viscous product:

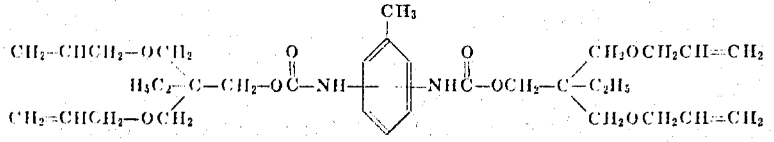

which will be referred to herein after as Prepolymer B.

EXAMPLE 3

2.2 moles of diallyl amine were charged to a 5 liter round bottom flask equipped with stirrer, thermometer (Graham Foil), condenser and dropping funnel. The flask was flushed with nitrogen and maintained under a nitrogen blanket. The flask was heated to 80° C with stirring and one mole of diglycidyl ether of Bisphenol A having a molecular weight in the range 370–384 and being commercially available from Shell Chemical Co., was gradually added to the flask from the dropping funnel over a two hour period. the flask was maintained at a temperature of 80°–90° C during the reaction by cooling. After the addition was complete, the reaction was continued with stirring at 80°–90° C for two more hours, at which time epoxide analysis content showed the reaction to be essentially complete. The flask was attached to a dry ice/acetone trap and vacuum pump to remove excess diallyl amine by heating at 80°–90° C and 1–10 mm Hg pressure with stirring over a 2 hour period. The resultant viscous product, i.e.,

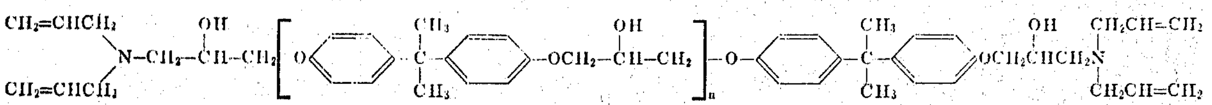

weighed 580 grams and will be referred to herein after as Prepolymer C.

EXAMPLE 4

100 grams of the polyene of the tetraene from Example 1 (Prepolymer A) containing as stabilizers, 0.2 grams of phosphorous acid, 0.3 grams of octadecyl $\beta$ (4-hydroxy-3,5-di-t-butylphenyl) propionate commercially available from Geigy Chemical Co. under the tradename "Irganox 1076" and 0.4 grams of 2,6-ditertiary-butyl-4-methylphenol commercially available under the tradename "Ionol" from Shell Chemical Co., was admixed with 81 grams of pentaerythritol tetrakis ($\beta$-mercaptopropionate) commercially available from Carlisle Chemical Co. under the tradename of "Q–43," and 18.1 grams of silicone oil commercially available under the tradename "L–45" from Union Carbide Co. 1.5 grams benzophenone was added to the mixture and the mixture stirred until homogeneously admixed. The viscous admixture was squeeged through a silk screen imaged in the land areas of a drilled printed circuit board to coat the board, except the land areas, with a 4-mil thick layer of the admixture. The board prior to coating had been electroless plated and electrolytically plated with copper followed by an electrolytic plating of a tin-lead solder over the copper circuit thereon on both sides of the board. The composition was exposed directly to a 275 watt RS sunlamp at a surface intensity on the composition of 4,000 microwatts/cm$^2$ for 60 seconds. The major spectral lines of this lamp were all above 3,000 angstroms. Such exposure caused curing and solidfication of the photocurable solder resist composition. The coating, exposure and development steps were repeated on the other side of the board. The leads of electrical components were inserted through the lands in the board. The board was then passed over foaming flux, i.e., "Hydrosolv 709," a fast drying organic flux commercially available from Alphametals Inc., Jersey City, New Jersey, to coat the land areas to be soldered with the flux. The board was then conveyed over a preheater maintained at a temperature of 700° F and then over a solder bath maintained at 500° F. The solder is then splashed on the under side of the board, thereby soldering the leads extending there-through to the board. The printed circuit boards with the electrical components soldered thereto are then washed in water to remove the flux and then dried. Inspection of the board showed that the cured composition was unaffected by the soldering steps and that no solder balling occurred.

EXAMPLE 5

100 grams of the polyene of the tetraene from Example 1 (Prepolymer A) containing as stabilizers, 0.2 grams of phosphorous acid, 0.3 grams of octadecyl $\beta$ (4-hydroxy-3,5-di-t-butylphenyl) propionate commercially available from Geigy Chemical Co. under the tradename "Irganox 1076" and 0.4 grams of 2,6-ditertiary-butyl-4-methylphenol commercially available under the tradename "Ionol" from Shell Chemical Co., was admixed with 81 grams of pentaerythritol tetrakis ($\beta$-mercaptopropionate) commercially available from Carlisle Chemical Co. under the tradename of "Q–43" and 18.1 grams of silicone oil commercially available under the tradename "L–45" from Union Carbide Co. 2.7 grams benzophenone was added to the mixture and the mixture stirred until homogeneously admixed. A 4-mil thick layer of the homogeneous admixture was coated onto the surface of a drilled printed circuit board which had previously been electroless plated and electrolytically plated with copper followed by an electrolytic plating of a tin-lead solder over the copper circuit thereon on both sides of the board by conventional means as described supra. A negative transparency of the circuit with only the lands areas imaged was placed in register with the board with an air gap of 15 mils there between. The composition was exposed through the transparency to a 275 Watt RS run-lamp sunlamp a surface intensity on the composition of 4,000 microwatts/cm² for 60 seconds. The major spectral lines of this lamp were all above 3,000 angstroms. Such exposure caused curing and solidification of the photocurable solder resist composition in the exposed areas while the unexposed land areas remained liquid. The unexposed, uncured solder resist composition was washed from the circuit board in an aqueous detergent solution containing sodium metasilicate and polyoxyethylene (15) tridecylether commercially available from Atlas Chemical Co. under the tradename "RENEX 31." The coating, imaging and development steps were repeated on the other side of the board. The leads of electrical components are inserted through the lands in the board. The board is then passed over foaming flux, i.e., "Hydrosolv 709" a fast drying organic flux commercially available from Alphametals Inc., Jersey City, New Jersey, to coat the areas to be soldered with flux. The board is then conveyed over a preheater maintained at a temperature of 700° F and then over a solder bath maintained at 500° F. The solder is splashed on the under side of the board, thereby soldering the leads extending there-through to the board. The printed circuit boards with the electrical components soldered thereto are then washed in a suitable cleaning solvent such as water where the flux is water soluble and then dried. Inspection of the board showed that the cured composition was unaffected by the soldering steps and that no solder balling occurred.

EXAMPLE 6

Example 4 was repeated except that 100 grams of Prepolymer B from Example 2 was substituted for Prepolymer A and 35 grams of silicone oil was employed. Inspection of the board showed that the cured composition was unaffected by the soldering steps, adhered well to the board and no solder balling occurred.

EXAMPLE 7

Example 4 was repeated except that 100 grams of triallyl isocyanurate was substituted for Prepolymer A and 147 grams of pentaerythritol tetrakis (β - mercaptopropionate) and 9.1 grams of silicone oil was employed. The resultant cured solder resist adhered well to the board, was unaffected by the solder bath and no solder balling occured.

EXAMPLE 8

Example 4 was repeated except that 67 grams of Prepolymer C, admixed with 33 grams of triallyl isocyanate, was substituted for Prepolymer A and 147 grams of pentaerythritol tetrakis (β-mercaptopropionate), along with 25 grams of silicone oil was employed. Inspection of the board showed that the cured composition adhered well to the board, was unaffected by the soldering steps and that no solder balling occurred.

EXAMPLE 9

Examples 4, 6, 7 and 8 were repeated with their respective compositions except that in no instance was silicone oil added to the composition. Inspection of the resulting boards showed that the compositions of Examples 4, 6, 7 and 8 were unaffected by the soldering steps, but that in all cases solder balling occurred requiring the boards to be rejected.

The following example shows that all compositions are not operable as a solder resistant photopolymer composition.

EXAMPLE 10

100 grams of Prepolymer C from Example 3, containing as stabilizers, 0.2 grams of phosphorous acid, 0.3 grams of octadecyl β (4-hydroxy-3,5-di-t-butylphenyl) propionate commercially available from Geigy Chemical Co. under the tradename "Irganox 1076" and 0.4 grams of 2,6-ditertiary-butyl-4-methylphenol commercially available under the tradename "Ionol" from Shell Chemical Co. was admixed with 91 grams of pentaerythritol tetrakis (β-mercaptopropionate) commercially available from Carlisle Chemical Co. under the tradename of "Q–43" and 19 grams of silicone oil commercially available under the tradename "L–45" from Union Carbide Co. 3.0 grams benzophenone was added to the mixture and the mixture stirred until homogeneously admixed. The viscous admixture was squeeged through a silk screen imaged in the land areas of a drilled printed circuit board to coat the board, except the land areas, with a 4-mil thick layer of the admixture. The board prior to coating had been electroless plated and electrolytically plated with copper followed by an electrolytic plating of a tin-lead solder over the copper circuit thereon on both sides of the board. The composition was exposed directly to a 275 Watt RS sunlamp at a surface intensity on the composition of 4,000 microwatts/cm² for 60 seconds. The major spectral lines of this lamp were all above 3,000 angstroms. Such exposure caused curing and solidification of the photocurable solder resist composition. The coating, exposure and development steps were repeated on the other side of the board. The leads of electrical components were inserted through the lands in the board. The board was then passed over foaming flux, i.e., "Hydrosolv 709," a fast drying organic flux commercially available from Alphametals Inc., Jersey City, New Jersey, to coat the land areas to be soldered with the flux. The board was then conveyed over a preheater maintained at a temperature of 700° F and then over a solder bath maintained at 500° F. The solder was then splashed on the under side of the board, thereby soldering the leads extending there-through to the board. The printed circuit boards with the electrical components soldered thereto were then washed in a suitable cleaning solvent, such as water in this case where the flux is water soluble, and then dried. Inspection of the board showed that the cured composition had poor adhesion to the board, thereby allowing solder between the cured composition and the board. Additionally, solder balling occurred.

EXAMPLE 11

Example 4 was repeated except that 2.0 grams of dibenzosuberone was substituted for the 1.5 grams of benzophenone. The results were the same as in Example 4.

EXAMPLE 12

Example 4 was repeated except that 89 grams of trimethylolpropane tris β mercaptopropionate was substituted for the 81 grams of pentaerythritol tetrakis (β-mercaptopropionate). The results were substantially the same.

EXAMPLE 13

Example 4 was repeated except that 40 grams of silicone oil was employed. After the admixture was squeeged through the silk screen imaged in the land aread, the composition separated into two phases prior to exposure. Inspection of the board showed that solder balling was prevalent over all the surface areas of the board.

EXAMPLE 14

100 grams of the polyene of the tetraene from Example 1 (Prepolymer A) containing as stabilizers, 0.2 grams of phosphorous acid, 0.3 grams of octadecyl β (4-hydroxy-3,5-di-t-butylphenyl) propionate commercially available from Geigy Chemical Co. under the tradename "Irganox 1076" and 0.4 grams of 2,6-ditertiary-butyl-4-methylphenol commercially available under the tradename "Ionol" from Shell Chemical Co. was admixed with 81 grams of pentaerythritol tetrakis (β-mercaptopropionate commercially available from Carlisle Chemical Co. under the tradename of "Q–43." 2.7 grams benzophenone was added to the mixture and the mixture stirred until homogeneously admixed. The admixture was squeegeed through a silk screen imaged in the land areas of a drilled printed circuit board to coat the board, except the land areas, with a 4-mil thick layer of the admixture. The resulting coating on the board was full of air bubbles. The board prior to coating had been electroless plated and electrolytically plated with copper followed by an electrolytic plating of a tin-lead solder over the copper circuit thereon on both sides of the board. The composition was exposed directly to a 275 Watt RS sunlamp at a surface intensity on the composition of 4,000 microwatts/cm$^2$ for 60 seconds. The major spectral lines of this lamp were all above 3,000 anstroms. Such exposure caused curing and solidification of the photocurable solder resist composition. The coating, exposure and development steps were repeated on the other side of the board. The leads of electrical components were inserted through the lands in the board. The board was then passed over foaming flux, i.e., "Hydrosolv 709," a fast drying organic flux commercially available from Alpha-metals Inc., Jersey City, New Jersey, to coat the land areas to be soldered with the flux. The board was then conveyed over a preheater maintained at a temperature of 700° F and then over a solder bath maintained at 500° F. the solder is then splashed on the under side of the board, thereby soldering the leads extending there-through to the board. The printed circuit boards with the electrical components soldered thereto are then washed in water, and then dried. Inspection of the board showed pin holes in the resultant cured solder resist which allowed solder to pass there-through and bridge underlying circuits, thus requiring the board to be rejected.

What is claimed is:

1. A solder resistant photopolymer composition consisting essentially of:

1. about one to 49 parts by weight of a polythiol containing at least two thiol groups per molecule;
2. about one to 49 parts by weight of a polyene selected from the group consisting of:

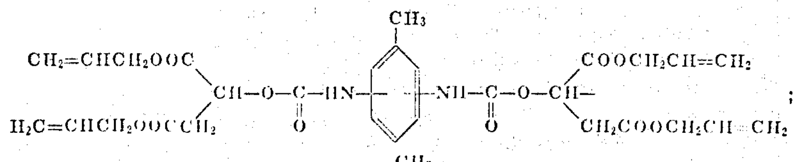
;

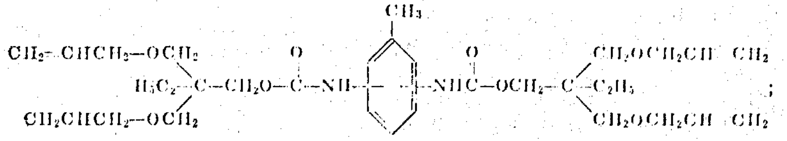
;

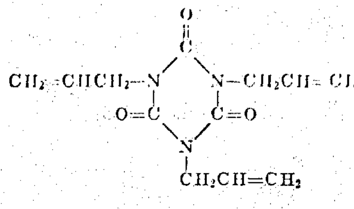

and a mixture of

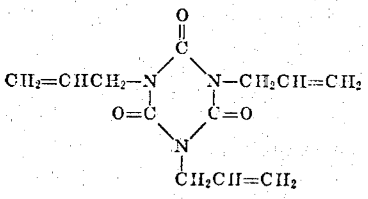

and

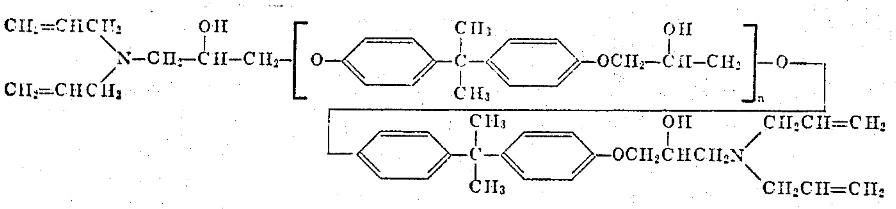

wherein $n$ is 0 or greater; and 3. five to 20 parts by weight based on the weight of (1) and (2) of silicone oil.

2. The composition of claim 2 including 0.05 to 10 parts by weight based on the weight of (1) and (2) of a photocuring rate accelerator 3. The composition of claim 1 including 0.1 to 5.0 parts per 100 parts by weight of (1) and (2) of a stabilizer selected from the group consisting essentially of phosphorous acid; pyrogallol; β (4-hydroxy-3, 5-di-t-butylphenyl) propionate; 2, 6- ditertiary-butyl-4-methylphenol and mixtures thereof.

* * * * *